United States Patent [19]

Wang

[11] Patent Number: 5,386,158
[45] Date of Patent: Jan. 31, 1995

[54] SENSING CIRCUIT FOR A FLOATING GATE MEMORY DEVICE

[75] Inventor: Ping Wang, Saratoga, Calif.

[73] Assignee: Silicon Storage Technology, Inc., Sunnyvale, Calif.

[21] Appl. No.: 149,152

[22] Filed: Nov. 8, 1993

Related U.S. Application Data

[63] Continuation of Ser. No. 33,978, Mar. 19, 1993, abandoned, which is a continuation of Ser. No. 851,477, Mar. 13, 1992, abandoned.

[51] Int. Cl.$^6$ .......................... G11C 7/00; H03K 3/01
[52] U.S. Cl. ................. 327/51; 365/189.07; 365/196; 365/210; 327/108; 327/541; 327/530; 327/546
[58] Field of Search ............... 307/530, 355, 364, 243, 307/571, 494, 464, 264, 270, 296.1, 296.5, 296.6, 296.8; 365/210, 189.07, 196

[56] References Cited

U.S. PATENT DOCUMENTS

| | | | |
|---|---|---|---|
| 4,223,394 | 9/1960 | Pathak et al. | 365/210 |
| 5,055,720 | 10/1991 | Tiede | 307/264 |
| 5,111,432 | 5/1992 | Miyaoka | 307/494 |
| 5,121,007 | 6/1992 | Aizaki | 307/264 |

Primary Examiner—Timothy P. Callahan
Assistant Examiner—Trong Phan
Attorney, Agent, or Firm—Limbach & Limbach

[57] ABSTRACT

A sensing circuit for a floating gate memory device is disclosed. The sensing circuit has a first voltage amplifier which generates a first output voltage, and a current amplifier which receives the first output voltage and generates a first output current in response thereto. The first voltage amplifier has a control transistor which generates a first output voltage in response to the memory device being in one state and a second output voltage in response to the memory device being in another state. The circuit also comprises a dummy cell, a second voltage amplifier connected thereto for generating a second output voltage. A second current amplifier receives the second output voltage and generates a second output current in response thereto. A comparator receives the first and second output currents, compares them, and generates an output indicative of the state of the memory device.

6 Claims, 2 Drawing Sheets

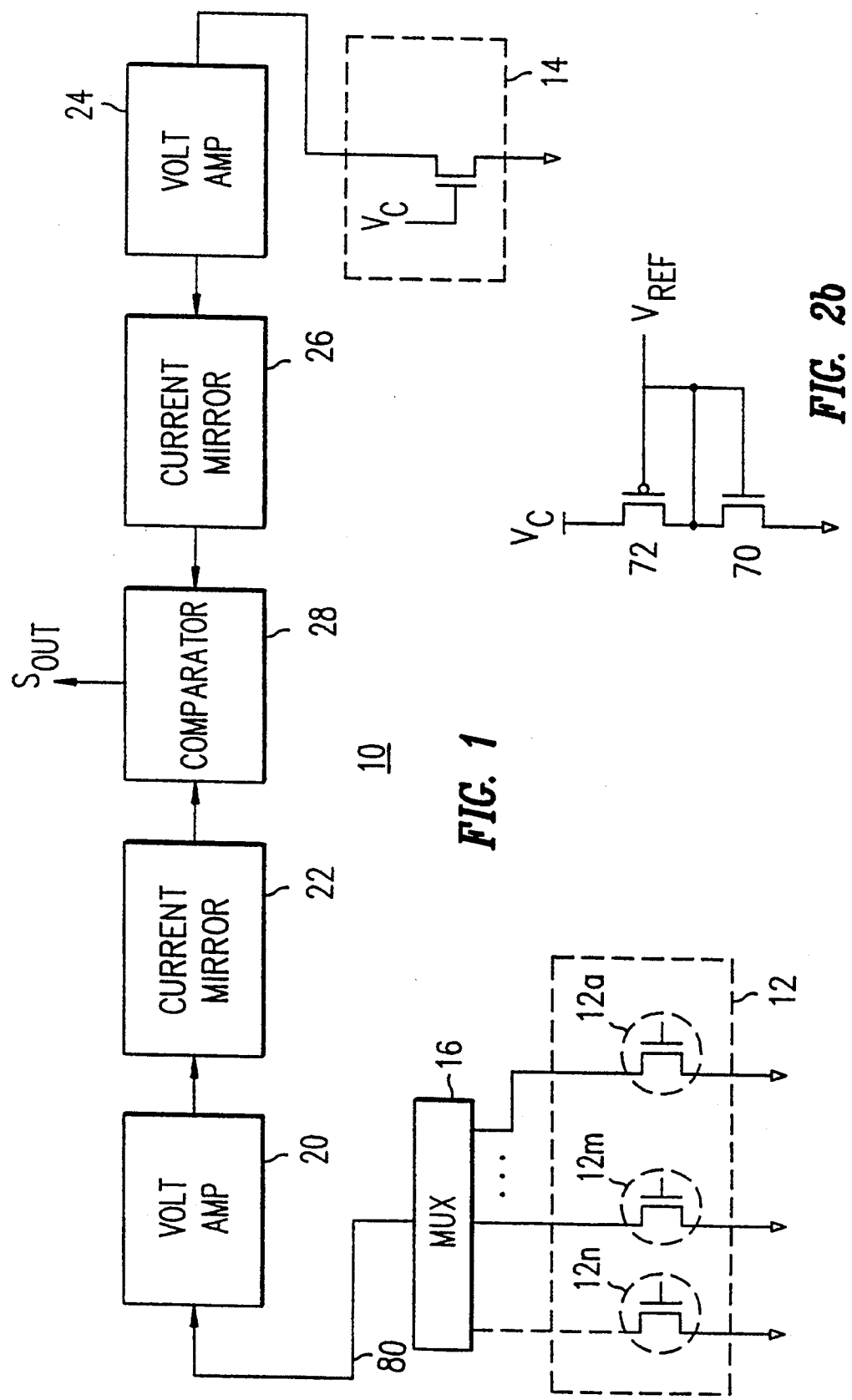

SENSING CIRCUIT FOR A FLOATING GATE MEMORY DEVICE

This is a continuation of co-pending application Ser. No. 08/033,978 filed on Mar. 19, 1993, now abandoned, which is a continuation application of Ser. No. 07/851,477 filed Mar. 13, 1992, now abandoned.

TECHNICAL FIELD

The present invention relates to a sensing circuit for use with a memory array comprised of floating gate devices. More particularly, the present invention relates to a pre-sense driver portion of the sensing circuit using a single control transistor having dual clamp levels.

BACKGROUND OF THE INVENTION

Sense amplifiers used with memory devices, such as floating gate memory devices, are well known in the art. See, for example, U.S. Pat. No. 4,223,394. However, in that reference, two transistors with differing thresholds are used to set the sensing level voltage. See, for example, column 4, lines 16–17 thereof. The drawbacks of this technique is that the threshold difference may vary with process and thus there is no assurance that the difference in the thresholds will be maintained. In addition, if the threshold difference is too great, speed in sensing suffers.

SUMMARY OF THE INVENTION

In accordance with the present invention, a sensing circuit for sensing the binary state of a first floating gate memory device is disclosed. The sensing circuit comprises a first line coupled to the first floating gate memory device. A first voltage amplifier means is coupled to the first line. The first voltage amplifier means has a first control transistor means coupled to the first line and being conductive irrespective of the binary state of the first memory device, The first control transistor means generates a first output voltage in response to the binary state of the first device, The first output voltage is a first voltage in response to the first device being in one state and is a second voltage in response to the first device being in another state, A first current amplifier means receives the first output voltage and generates a first current in response thereto, The first current is one level in response to the first voltage and is another level in response to the second voltage. A reference current is generated. The reference current is between the one level and the other level. An inverter receives both first and reference currents at its input and senses the binary state of the first device.

BRIEF DESCRIPTION OF THE DRAWINGS

FIG. 1 is a schematic block level diagram of the sensing circuit of the present invention used with a memory array comprising of a plurality of floating gate devices.

FIG. 2b is a diagram of a circuit for generating the reference voltage used in the circuit shown in FIG. 2a.

DETAILED DESCRIPTION OF THE DRAWINGS

Figure 2A:
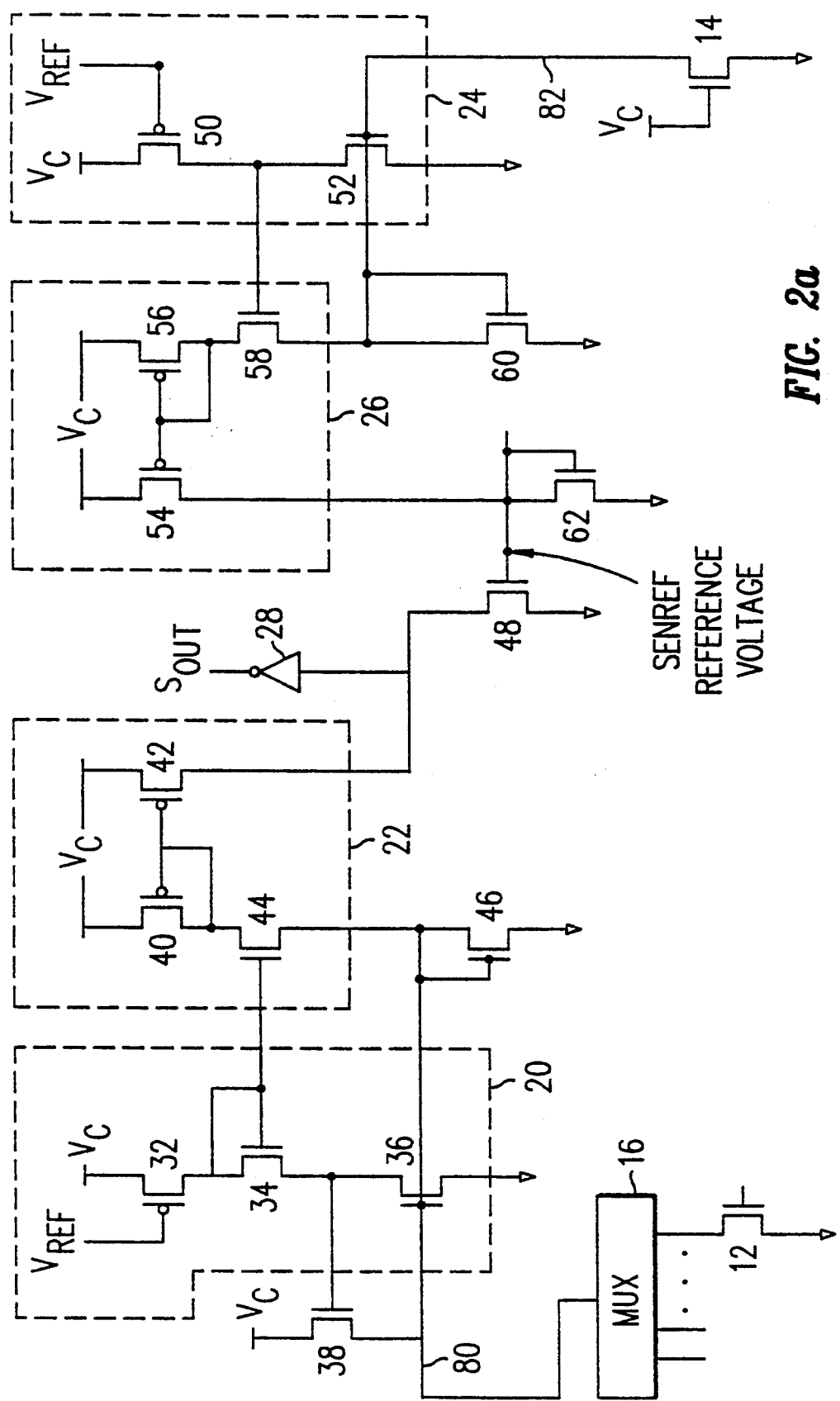
FIG. 2a is a circuit diagram of the sensing circuit shown in FIG. 1.

Referring to FIG. 1 there is shown in block diagram form the sensing circuit 10 of the present invention, The sensing circuit 10 is to be used with a memory array 12 comprising of a plurality of floating gate memory devices such as, 12a, ... 12n. The plurality of memory devices 12(a ... n) are arranged in a plurality of rows and columns, as is well known in the art. The plurality of columns of memory devices are all supplied to a multiplexer 16. When it is desired to sense the state (either conducting or nonconducting) of a particular floating gate memory device in a particular column, that column is connected through the multiplexer 16 to a first line 80, and is supplied to a first voltage amplifier 20.

The first voltage amplifier 20 outputs a first output voltage which is supplied to a first current mirror 22. The first current mirror 22 generates a first current in response thereto which is supplied to a comparator 28.

The state of a floating gate memory device 12(a–n) is compared to a so-called "dummy" floating gate memory device 14. The dummy memory device 14 is connected to a second voltage amplifier 24. The second voltage amplifier 24 generates a second output voltage in response thereto. The second output voltage is supplied to a second current mirror 26. The second current mirror 26 generates a second current which is also supplied to the comparator 28. The comparator 28 compares the first current and the second current and generates a signal $S_{OUT}$, in response thereto, with the signal $S_{OUT}$ representing the state of the floating gate memory cell 12 being sensed.

Referring to FIG. 2a there is shown in greater detail the sensing circuit 10. The floating gate memory cell 12 whose state is to be sensed is connected through the multiplexer 16 to a first sensing line 80. A MOS transistor 38 is connected to the first sensing line 80. The MOS transistor 38 has a source, a gate and a drain. As used hereinafter and as is well known in the art, the term "source" and the term "drain" can be used interchangeably. The source is connected to the first sensing line 80. The drain is connected to a source of positive voltage potential such as $V_c$. The gate is connected to the first voltage amplifier 20. The first sensing line 80 is also connected to the first voltage amplifier 20.

The first voltage amplifier 20 comprises a P-type MOS transistor 32 and two N-type MOS transistors 34 and 36, respectively. The gate of the MOS transistor 36 is connected to the first sensing line 80. The source of the MOS transistor 36 is connected to a ground potential. The drain of the MOS transistor 36 is connected to the gate of the MOS transistor 38 and to the source of the MOS transistor 34. The drain and gate of the MOS transistor 34 are connected together and to the drain of the P-type MOS transistor 32. The gate of the transistor 32 is connected to a source of positive reference voltage, $V_{REF}$. The source of the P-type MOS transistor 32 is connected to the positive voltage source $V_c$.

From the first voltage amplifier 20, the signal is supplied to a first current mirror 22. The first current mirror 22 comprises two P-type MOS transistors 40 and 42, and an N-type MOS transistor 44. The gate of the MOS transistor 44 is connected to the gate of the MOS transistor 34. The drain of the transistor 44 is connected to the drain of the P-type MOS transistor 40, which is also connected to its gate. The source of the P-type MOS transistor 40 is connected to a source of positive voltage potential $V_c$. The gate of the P-type MOS transistor 40 is also connected to the gate of the P-type MOS transistor 42. The source of the P-type MOS transistor 42 is connected to a source of positive voltage potential $V_c$.

Thus, in this manner, the P-type MOS transistor 40 and 42 operate as a current mirror.

The first sensing line 80 is also connected to an N-type MOS transistor 46. The drain and the gate of the MOS transistor 46 are connected together and to the first sensing line 80 as well as to the source of the MOS transistor 44. The source of the MOS transistor 46 is connected to ground potential. Transistor 46 functions as a diode connected transistor. The drain of the P-type MOS transistor 42 is supplied to an input of an inverter 28.

The sensing circuit 10 also comprises a so-called "dummy" cell 14. The dummy cell 14 is a floating gate memory cell which is always in the conductive state. It has a source, gate and a drain with the source connected to a ground potential and the gate connected to a source of a positive voltage potential such as $V_c$. Since the gate of the "dummy" cell 14 is connected to a source of a positive voltage potential, it is always in the conductive state. The drain is connected to a second sensing line 82.

The second sensing line 82 is supplied to a second voltage amplifier 24. The second voltage amplifier 24 comprises a P-type MOS transistor 50 and an N-type MOS transistor 52. The N-type MOS transistor 52 has its gate connected to the second sensing line 82. The source of the MOS transistor 52 is connected to ground potential. The drain of the MOS transistor 52 is connected to the drain of the P-type MOS transistor 50. The gate of the P-type MOS transistor 50 is connected to the same source of positive reference voltage, $V_{REF}$, as the gate of the transistor 32 is connected. The source of the P-type type MOS transistor 50 is connected to a source of positive voltage potential $V_c$.

From the second voltage amplifier 24, the signal from the dummy cell 14 along the second sensing line 82 is then supplied to the second current mirror 26. The second current mirror 26 is identical to the first current mirror 22. It also comprises two P-type MOS transistors 54 and 56 and a N-type MOS transistor 58. The P-type MOS transistors 54 and 56 are connected in a current mirror configuration. In addition, the signal from the second sensing line 82 is supplied to an N-type MOS transistor 60. The N-type MOS transistor 60 is identical to the N-type MOS transistor 46 and like the N-type MOS transistor 46 serves to function as a diode connected transistor.

From the second current amplifier 26, the signal is supplied from the drain of the P-type MOS transistor 54. The drain of the P-type MOS transistor 54 is connected to an N-type MOS transistor 62 at its drain. In addition, the drain and the gate of the N-type MOS transistor 62 are connected together. The source of the N-type MOS transistor 62 is connected to a ground potential. The output of the second current mirror 26 at the drain of the P-type MOS transistor 54 is a constant current source. This constant current source is supplied to the gate of an N-type MOS transistor 48 whose drain is connected to the inverter 28 and whose source is connected to ground potential. The voltage at the gate of the transistor 48 is a reference voltage denoted as Senref.

In the operation of the sensing circuit 10, if we assume that the floating gate memory cell 12 is in a conductive state, the current will flow along the first sensing line 80. If we assume that the current flowing on the first sensing line 80 due to the conduction of the floating memory cell 12 is stronger than the amount of current that transistor 44 can supply, then the voltage at the gate of the transistor 38 will rise. When the voltage at the gate of transistor 38 is one threshold greater than the voltage on the first sensing line 80, then transistor 38 will conduct and clamp or hold the voltage on the first sensing line 80 at that level. At that time, the voltage at the gate of transistor 34 would be one threshold greater than the voltage at the gate of transistor 38 while the voltage at the sensing line 80 is maintained at the low clamp level, designated as VL. Current flow will be from transistor 40 through transistor 44 onto the first sensing line 80 to maintain the conductive state of the cell 12.

If the floating memory cell 12 is in a nonconductive state, then no current would flow along the first sensing line 80. If we assume that the voltage on the first sensing line 80 is initially zero, then both transistors 38 and 44 will initially be on to bring up the voltage on the first sensing line 80. When the voltage on the first sensing line 80 goes up, the voltage at both the gate of transistor 34 and the gate at transistor 38 will go down. Transistor 38 will be turned off when the voltage at its gate is no longer one threshold greater than the voltage on the first sensing line 80. At that point, since the voltage at the gate of transistor 34 is one threshold greater than the voltage at the gate of transistor 38, transistor 44 would still be on. Therefore, transistor 40 would continue to supply current to charge up the first sensing line 80 through transistor 44. Voltage on the first sensing line 80 will reach a saturation level when the current through the transistor 44 approaches the current through transistor 46 where transistor 46 is acting as a diode connected transistor, which prevents voltage on the first sensing line 80 from going too high and cutting off transistor 44. At the saturation point, the voltage on the first sensing line 80 would be at a high clamp level, designated as VH.

The mechanism of sensing is accomplished through transistors 40, 42, 48 and inverter 28. As can be seen from FIG. 2a, the single input to the inverter 28 is connected to both the drain of the P-type MOS transistor 42 and to the drain of the N-type MOS transistor 48. Depending upon the net current flow into or out from the single input to the inverter 28, the output of the inverter 28, $S_{out}$, will either be high or low. The current flow through transistor 42 mirrors the current flow through transistor 40. Thus, the current flow into the inverter 28 mirrors the current flow through the transistor 40. If the current flow through transistor 42 is greater than the current flow through transistor 48, which has a reference current flow therethrough, then the voltage at the input to the inverter 28 will rise to a high level. This high level would cause the comparator 28 or inverter 28 to invert the signal and $S_{OUT}$ will go low to indicate a conductive state in the cell. If the current through transistor 42 is less than the current through transistor 48, then the voltage at the input to the inverter 28 will fall and a non-conductive state will be detected. The nonconductive state or the low state, is inverted by the inverter 28 and $S_{OUT}$ will be high.

Transistors 32 and 36 form an amplifier whose gain is determined by the biasing reference voltage, $V_{REF}$. If we assume the gain of the transistor 32–36 amplifier is Av, then at any time the voltage at the gate of transistor 38 is $$V(G_{38}) = V(G_{34}) - V_T \qquad (1)$$

at VL or low level clamp $$VL(G_{38}) = VL(\text{line } 80) + V_T \quad (2)$$

at VH or high level clamp $$VH(G_{34}) = VH(\text{line } 80) + V_T \quad (3)$$

Therefore, substituting (1) into (3), $$VH(G_{38}) = VH(\text{line } 80) \quad (4)$$

(4) - (2) results in $$VH(G_{38}) - VL(G_{38}) = VH(\text{line } 80) - VL(\text{line } 80) - V_T \quad (5)$$

Since the amplifier has a gain of Av, $$VH(G_{38}) - VL(G_{38}) = Av^*(VH(\text{line } 80) - VL(\text{line } 80)) \quad (6)$$

Substituting (6) into (5) gives, $$VH(\text{line } 80) - VL(\text{line } 80) = -V_T/(Av-1) \quad (7)$$

If $Av = -5$, $V_T = 0.6$, the total voltage swing is $$VH(\text{line } 80) - VL(\text{line } 80) = 0.1v$$

The generation of reference voltage, Senref, is accomplished as follows. The dummy cell 14 is a floating gate memory cell whose select gate and floating gate are connected to $V_c$. Thus, the voltage on the second sensing line 82 is very close to the voltage on the first sensing line 80. The current flow through the dummy cell 14 is controlled by the second voltage amplifier 24. The second voltage amplifier comprises transistors 50 and 52, and form an amplifier with the same gain as the amplifier formed by transistors 32 and 36. The current flowing through the second sensing line 82 is mirrored by the transistors 54, 56 and 58 of the second current mirror 26. The voltage, Senref, developed at the gate of transistor 48 is used to bias the transistor 48 to generate a reference current for sensing.

Referring to FIG. 2b, there is shown a circuit comprising a P type transistor 72 and an N type transistor 70 for generating the reference voltage $V_{REF}$. The voltage $V_{REF}$ is supplied to the gate of the P type transistor 50 of voltage amplifier 24 and P type transistor 32 of the voltage amplifier 20. The circuit comprises a P type transistor 72 having its source connected to a source of positive voltage potential $V_c$ with its drain connected to the drain of the N type transistor 70 and with the source of the N type transistor 70 connected to ground. The gates of the transistors 70 and 72 are connected together as well as being connected to the connection between the transistor 70 and 72 and forms the output of $V_{REF}$. This is a typical implementation for a voltage reference circuit for the sense amplifier bias.

In summary, when the floating gate memory cell 12 is in a non-conductive state, transistor 44 is turned on. When the floating gate memory cell 12 is in a conductive state, transistors 38 and 44 are both turned on. Thus, irrespective of the state of conduction of the floating gate memory cell 12, transistor 44 will always be on. To turn transistor 44 on, transistor 34 of voltage amplifier 20 generates an output voltage in response to the binary state of the floating gate memory cell 12 being in one state and generates a second output voltage in response to the binary state of the floating gate memory cell 12 in another state. Transistor 38 acts as a feedback transistor to force transistor 36 to be conductive at all times. As previously stated, if the floating gate memory cell 12 is in a conductive state, transistor 38 will conduct and clamp or hold the voltage on the first sensing line 80, maintaining it at the low clamp level, designated at VL. If the floating memory cell 12 is in a nonconductive state, then no current will flow along the first sensing line 80. This would cause transistor 38 to conduct until the voltage on the first sensing line 80 goes up to a high clamp level, designated as VH. When transistor 38 conducts, transistor 36 would also conduct causing transistor 34 to conduct. Thus, transistor 34 is also always conductive irrespective of the state of the floating gate memory cell 12. The voltage at the gate of transistor 58, derived by the current flowing through the second sensing line 82, will always be a voltage between the first output voltage and the second output voltage generated at the gate of the transistor 34.

As can be seen from the foregoing, a single transistor 34 is used to achieve dual clamp level. In addition, since the sensing at the input to the inverter 28 is determined by the reference voltage Senref and by the size of the transistor 44, transistor 44 can be made of the same type of transistor as the floating gate memory array 12. Thus, any memory cell variation caused by process, temperature, etc., is reflected in the transistor 44. In addition, of course, the dummy cell 14 can also be made of the same transistor as the memory cell array transistors 12. In this manner, self-tracking of the dummy cell as well as the critical component of the sensing circuit 10 is achieved.

What is claimed is:

1. A sensing circuit for sensing the binary state of a first floating gate memory device having two states, comprising a first line coupled to said first memory device;

a voltage amplifier means coupled to said first line comprising:

a first transistor having a source, a drain, and a gate; said source connected to a first voltage source, and said gate connected to a second voltage source;

a control transistor having a source, a gate, and a drain, with the drain connected to the gate, and to the drain of the first transistor, and providing a first output voltage said first output voltage being a first voltage in response to said first memory device being in one binary state, and being a second voltage in response to said first memory device being in another binary state;

a second transistor having a source, a drain and a gate, said drain connected to said source of said control transistor, said gate connected to said first line, and said source connected to a third voltage source;

a first current amplifier means for receiving said first output voltage and for generating a first output current in response thereto said first output current being a first current in response to said first output voltage being a first voltage, and being a second current in response to said first output voltage being a second voltage;

a second floating gate memory device substantially identical to said first device;

a second line coupled to said second device;

a second voltage amplifier means coupled to said second line for generating a second output voltage, said second output voltage being between said first voltage and said second voltage;

a second current amplifier means for receiving said second output voltage and for generating a second output current in response thereto said second output current having an amount between said first current and said second current; and means for receiving said first and second output currents for comparing said first and second output currents for determining the greater of said first and second output currents to sense the binary state of said first memory device, wherein in the event said first output current is greater, said first memory device is in one state, and in the event said second output current is greater, said first memory device is in another state.

2. The circuit for claim 1 wherein said first and second current amplifier means are substantially identical.

3. The circuit of claim 1 wherein said first voltage amplifier means limits the voltage swing on said first line to approximately 0.1 volt.

4. The circuit of claim 1 wherein said first voltage source is a positive potential source.

5. The circuit of claim 1 wherein said third voltage source is ground potential.

6. The sensing circuit of claim 1 further comprising:
a third transistor having a source, a drain, and a gate, said source connected to said first voltage source, said gate connected to the drain of said second transistor and said drain connected to said first line.

* * * * *